(12) United States Patent
Napijalo et al.

(10) Patent No.: US 7,230,319 B2
(45) Date of Patent: Jun. 12, 2007

(54) ELECTRONIC SUBSTRATE

(75) Inventors: Veljko Napijalo, Dublin (IE); Brian Kearns, Dublin (IE)

(73) Assignee: TDK Corporation, Tokyo (JP)

( * ) Notice: Subject to any disclaimer, the term of this patent is extended or adjusted under 35 U.S.C. 154(b) by 312 days.

(21) Appl. No.: 11/097,239

(22) Filed: Apr. 4, 2005

(65) Prior Publication Data

US 2006/0220237 A1    Oct. 5, 2006

(51) Int. Cl.
H01L 29/40 (2006.01)
H01L 39/00 (2006.01)
H01L 23/62 (2006.01)
H01L 23/58 (2006.01)
H01L 23/538 (2006.01)

(52) U.S. Cl. .................. 257/664; 257/662; 257/663; 257/665; 257/E23.174

(58) Field of Classification Search .......... 257/662, 257/663, 664, 665, E23.174
See application file for complete search history.

(56) References Cited

U.S. PATENT DOCUMENTS

| | | | | |
|---|---|---|---|---|
| 5,170,235 A | * | 12/1992 | Tanino | ............ 257/276 |
| 5,852,391 A | * | 12/1998 | Watanabe et al. | ............ 333/246 |
| 5,945,700 A | * | 8/1999 | Mizutani | ............ 257/259 |
| 6,757,523 B2 | * | 6/2004 | Fry | ............ 455/78 |
| 7,139,538 B2 | * | 11/2006 | Ono et al. | ............ 455/127.1 |
| 7,193,472 B2 | * | 3/2007 | Gotou et al. | ............ 330/295 |
| 2004/0145034 A1 | * | 7/2004 | Fujioka et al. | ............ 257/664 |

* cited by examiner

*Primary Examiner*—Luan Thai
(74) *Attorney, Agent, or Firm*—Oliff & Berridge, PLC (57) ABSTRACT

A substrate for mounting a device is disclosed. The substrate includes at least one transition for providing an RF connection to a lead of the device, the lead extending from a device input to an otherwise free end. The transition comprises two spaced apart electrically coupled members, the first member occupying at least the same area on a top surface of the substrate as the device lead to which it is to connect, and the second member lying in register with the first member. The transition comprises an input, which is located at the end of the second member which is nearest the free end of the device lead and an output which is located at the opposite end of the first member and which is in register with the device input. The electrical characteristics of the transition are such that the electrical length from the input of the transition to the output of the transition is approximately equal to one half of a wavelength over a given operating frequency band of the device.

10 Claims, 8 Drawing Sheets

ELECTRONIC SUBSTRATE

TECHNICAL FIELD TO WHICH THE INVENTION BELONGS

The present invention relates to a substrate including a transition member allowing an electronic device to effectively connect to other mounted devices or metalised tracks or terminals fabricated on the same substrate. The invention is useful for providing RF amplifiers, RF components and devices, RF modules, test and measurement circuits, and evaluation PCBs.

BACKGROUND OF THE INVENTION/PRIOR ART

The characteristics of an electronic device are typically defined in terms of a set of data including s-parameters, noise figures, gain tables etc. For packaged RF devices, in addition to the above parameters, the mechanical dimensions of the leads also contribute to electrical performance of the device.

The degree of influence of the device leads on the electrical performance of the device is dependent on the applicable frequency range of operation of the device, the physical dimensions of the device leads and the substrate on which the device is mounted.

For RF applications up to several tens of Gigahertz, the physical dimensions of the device leads can be of critical importance, because at higher frequencies, the device leads have an electrical length which is significant compared to one half of the wavelength for the frequency of operation of the device. Similarly, the type of substrate on which the device is mounted affects the performance of the device, because the electrical characteristics of metalised tracks fabricated on the substrate are determined by the dielectric constant of the substrate material and by the thickness of the substrate.

For such high frequency operation, electrical connections from the device to the input/output terminals of the substrate, or from one device to another on the substrate are usually designed to have the properties of an electrical transmission line with a given characteristic impedance; for example, microstrip, co-planar waveguide, or stripline structures are often employed. Microstrip lines are the industry preferred method of high frequency connection, due to the inherent high loss associated with stripline structures, and due to the need for perfect symmetry in the fabrication of co-planar waveguides.

Figure 1:
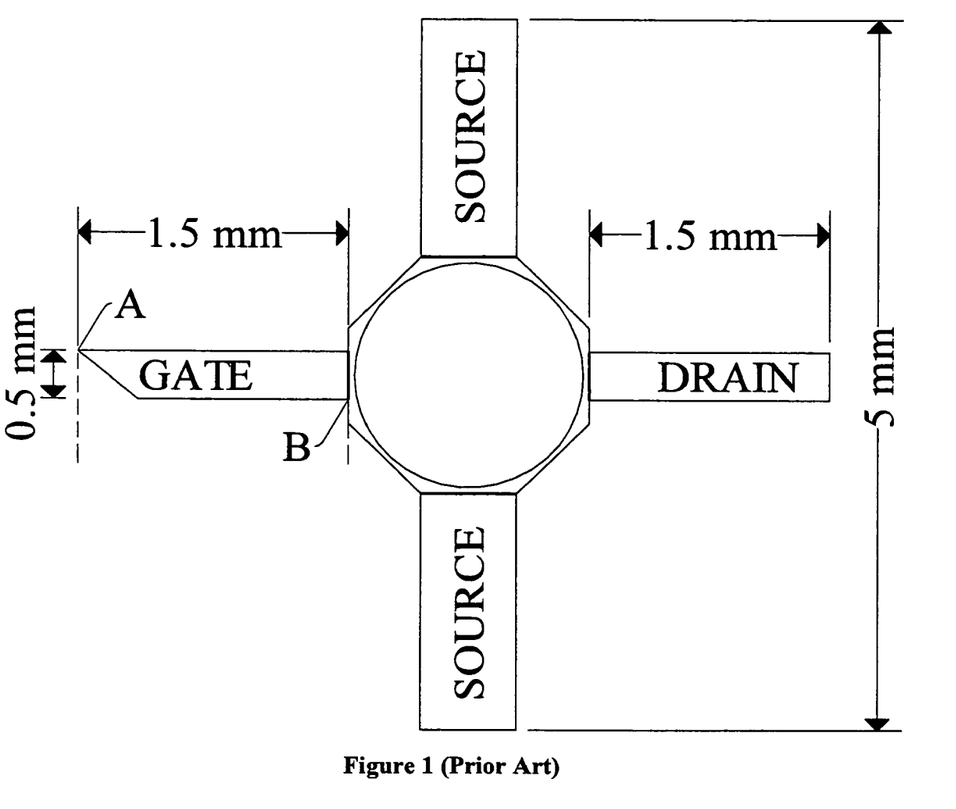
FIG. 1 shows the mechanical dimensions of a typical FET.

FIG. 1 shows the physical dimensions of a proprietary packaged field effect transistor (FET) designed for RF applications up to 30 GHz. It can be seen that in the case shown the leads connecting to the gate and to the drain of the FET have a length of 1.5 mm and a width of 0.5 mm. At 30 GHz, a half-wave microstrip line fabricated on a PCB with a dielectric constant of 3.5 has a length of 2.68 mm, so it is apparent that the leads will have a significant effect on the RF performance of the FET of FIG. 1

Figure 2A:
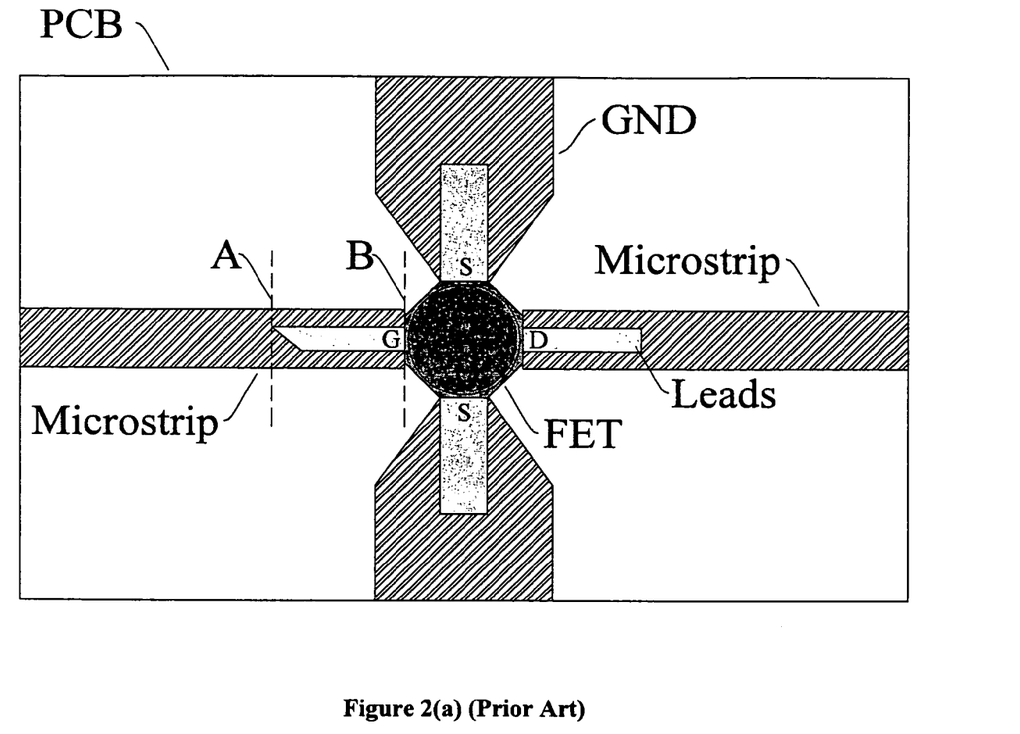
FIG. 2(a) is a top view of a conventional PCB type substrate for mounting the FET of FIG. 1 using microstrip traces.

One approach to minimize the effects of the leads on the RF performance of the FET of FIG. 1 is to mount the FET on a substrate where the electrical connections to the FET are in the form of microstrip transmission lines of specified characteristic impedances, and where the width of each microstrip transmission line is greater than or equal to the width of the corresponding lead on the packaged FET. This method for mounting the FET of FIG. 1 is shown in FIG. 2(a) (top view) and FIG. 2(b) (side view). It can be seen that the device leads have become part of the microstrip transmission lines which connect directly to the gate G and to the drain D of the FET. Also, it can be seen from FIG. 2 that the section of line from the point A to the point B defined by the lead connecting to the gate G of the FET connects seamlessly with the microstrip transmission line at the point A.

Figure 2B:
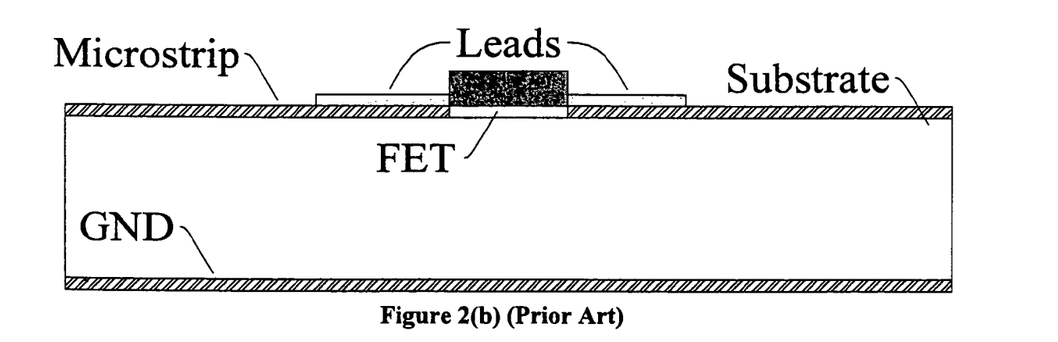

The method of RF connection depicted in FIG. 2 eliminates any discontinuities resulting from changes in the widths of the transmission lines at the ends of the FET leads; however, this method of mounting a high frequency FET on a substrate suffers from the drawback that the design of a microstrip line with the preferred characteristic impedance may not be possible when the minimum width of the microstrip line is limited by the width of the FET leads, as shown in FIG. 2.

Consider the substrate on which the FET will be mounted. Typical properties of two common substrate materials, low temperature co-fired ceramic (LTCC) and Teflon fiberglass (often referred to by its proprietary name, Duroid) are given in table 1 below.

TABLE 1

Dielectric constant of LTCC and Teflon fiberglass

| Material | Dielectric Constant $\epsilon_r$ |
|---|---|
| LTCC | 7.9 |
| Teflon fiberglass | 2.2 |

For control of the characteristic impedance of a microstrip line, where the width of the line is restricted to a particular minimum as described above, the thickness of the substrate must be set to a particular value; however, in practice the designer does not have control over the substrate thickness because the range of thickness of commercially available substrates is limited—for example Teflon fiberglass is typically available in integer multiples of 0.254 mm, and because other design factors may dictate the thickness of the substrate to be used.

The two following substrates are used as examples to highlight the problems with obtaining the correct characteristic impedance using microstrip lines for RF connections to the FET as shown in FIG. 2: an LTCC substrate with a thickness of 0.32 mm; and a Teflon fiberglass substrate with a thickness of 0.508 mm. Table 2 gives the resulting characteristic impedance for a microstrip line fabricated on each of the above substrates and for the case where the width of each microstrip line is 0.6 mm (i.e. 0.1 mm greater than the widths of the leads of the FET of FIG. 1). Table 2 also gives the phase delay at 24 GHz for each microstrip line, and for a line length of 1.5 mm (i.e. the same as the lengths of leads of the FET of FIG. 1).

TABLE 2

Electrical characteristics of 0.6 mm × 1.5 mm lines on two different substrates.

| Substrate | Characteristic impedance | Phase delay at 24 GHz |
|---|---|---|
| LTCC, h = 0.32 mm, $\epsilon_r$ = 7.9 | 39 Ω | 106° |
| Teflon fiberglass, h = 0.508 mm, $\epsilon_r$ = 2.2 | 88 Ω | 58° |

Thus, it can be seen that a suitably sized microstrip line fabricated on the LTCC substrate of table 2 will have a characteristic impedance of 39 Ohms and will have phase delay of 106°, and that a suitably sized microstrip line fabricated on the Teflon fiberglass substrate of table 2 will have a characteristic impedance of 88 Ohms and will have a phase delay of 58°. In each of the above cases the characteristic impedance of the line can be reduced by increasing the width of the line, but the characteristic impedance cannot be increased, because the minimum width of the line is determined by the dimensions of the FET leads.

For typical RF applications of an FET, matching circuits for the gate and the drain of the FET are provided on the substrate on which the FET is mounted, and each matching circuit is connected either directly to the terminals of the FET or to the terminals of the FET via a microstrip transmission line. The matching circuit or the combination of the matching circuit and the microstrip transmission line provides the optimum terminating impedance at each input of the FET. For example, a particular application of the FET of FIG. 1 requires that the matching circuit be connected to the gate of the FET via a microstrip line with a characteristic impedance of 120 Ohms.

Figure 3:
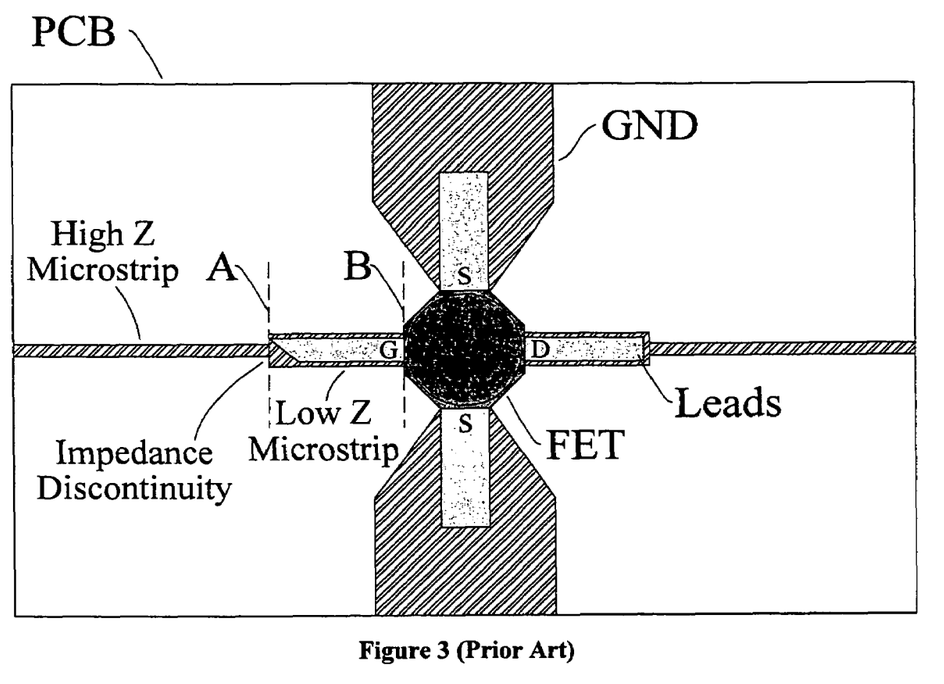
FIG. 3 shows the impedance discontinuity resulting from the conventional method of connection the leads of a FET to a high impedance microstrip line.

FIG. 3 shows a high impedance microstrip line connecting from a remotely located matching circuit to the gate G of the FET. It can be seen that the high impedance microstrip transmission line which connects from the remotely located matching circuit to the gate G of the FET, is inevitably connected to the FET via the low impedance line defined by the lead of the FET which extends from point A to point B of FIG. 3.

As described above, the low impedance transmission line extending from point A to point B in FIG. 3 will have a characteristic impedance of 39 Ohms for the LTCC substrate of table 2 and 88 Ohms for the Teflon fibreglass substrate of table 2. Moreover, since the phase delay of each microstrip line given in table 2 is respectively 106° and 58°, the impedance presented at the input of the FET B, will be substantially different from the optimum value at the end of the high impedance microstrip transmission line, at the point A on the substrate.

Figure 4A:
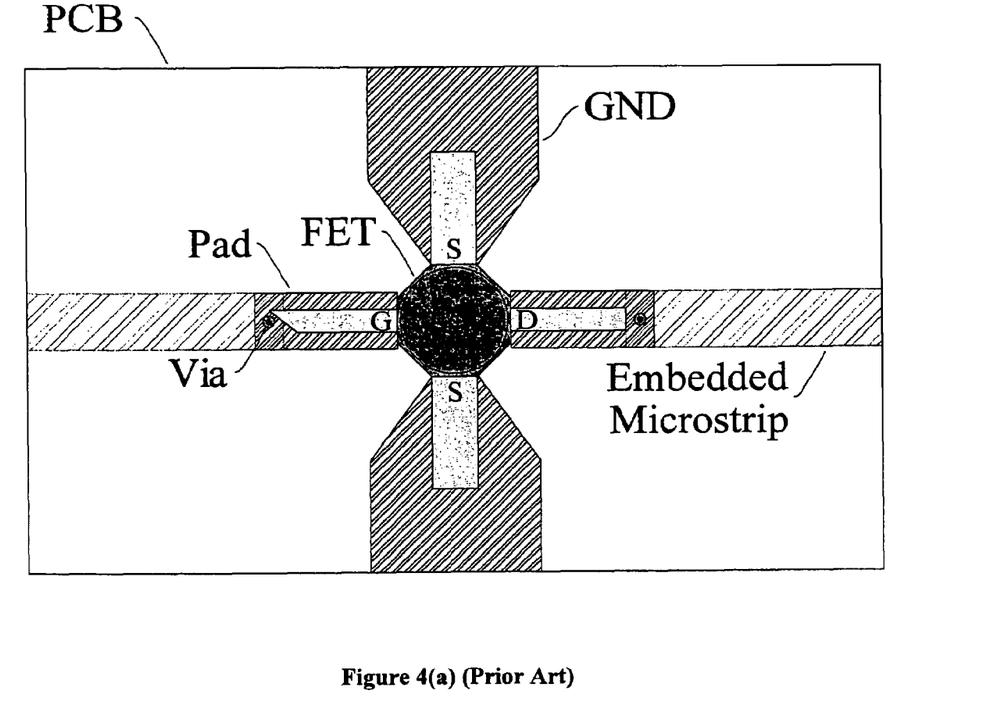
FIG. 4(a) is a top view of a conventional PCB for mounting the FET of FIG. 1 using embedded microstrip traces.
Figure 4B:
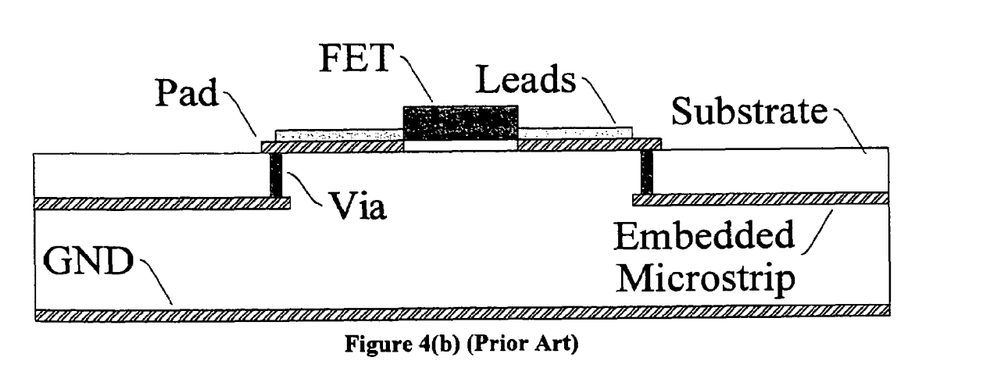

An alternative to the method of mounting a high frequency FET on a substrate to that depicted in FIG. 2 and FIG. 3, is to employ a multilayer substrate as illustrated in FIG. 4(a) (top view) and FIG. 4(b) (side view). The multilayer substrate of FIG. 4 comprises solder pads for the FET on the top surface of the substrate and further comprises microstrip connecting lines which are embedded on a sub-layer of the multilayer substrate. Electrical connections from the embedded microstrip lines to the solder pads on the top surface of the substrate are made by electrically conducting via holes which run from the microstrip lines on the sub layer to the top surface.

The method of mounting a high frequency FET on a substrate depicted in FIG. 4 is often preferred for mass production purposes, because the FET will self-align during re-flow soldering if the top surface comprises only RF pads for the device. This method is also preferred in cases where a number of devices share the same substrate, and where the tracks connecting each device would inevitably cross over if they were fabricated on the top layer of the substrate. However the track ends and via holes which result from adopting this approach introduce discontinuities in the microstrip lines which degrade the matching of the microstrip lines to the terminating impedances at each end. Furthermore, the method of mounting a high frequency FET on a substrate depicted in FIG. 4 does not solve the problems which arise from the physical dimensions of the leads of the FET as described earlier.

STATEMENT OF INVENTION

The present invention provides a substrate according to claim 1.

The invention enables RF connection of a packaged device, such as the FET of FIG. 1, to another device or to the input or output terminals of the substrate.

The invention comprises a coupled microstrip line transition, which effects RF connection to a device mounted on a substrate, where the transition comprises an input side, which is located near the free end of the device lead A and an output side which is located at the input of the device B and where the electrical length of the transition is equal to one half of the wavelength of the centre frequency of the operating band of the device.

Accordingly, a matching circuit with the appropriate impedance for the device can be placed at the input of the transition, located near the end of the device lead A and the impedance presented at the output of the transition, located at the input of the device B will be identical to that of the matching circuit.

In a preferred embodiment, metalised connecting tracks are embedded on a sub-layer of a multilayer substrate, so that the exposed metalised tracks on the top surface of the multilayer substrate are provided to facilitate soldering of the device leads to the substrate and are limited to an area slightly larger than the device leads.

BRIEF DESCRIPTION OF THE DRAWINGS

Embodiments of the invention will now be described, by way of example, with reference to the accompanying drawings, in which:

FIG. 2(b) is a side view of the PCB of FIG. 2a;

FIG. 4(b) is a side view of the PCB of FIG. 4a;

DESCRIPTION OF THE PREFERRED EMBODIMENTS

Figure 5:
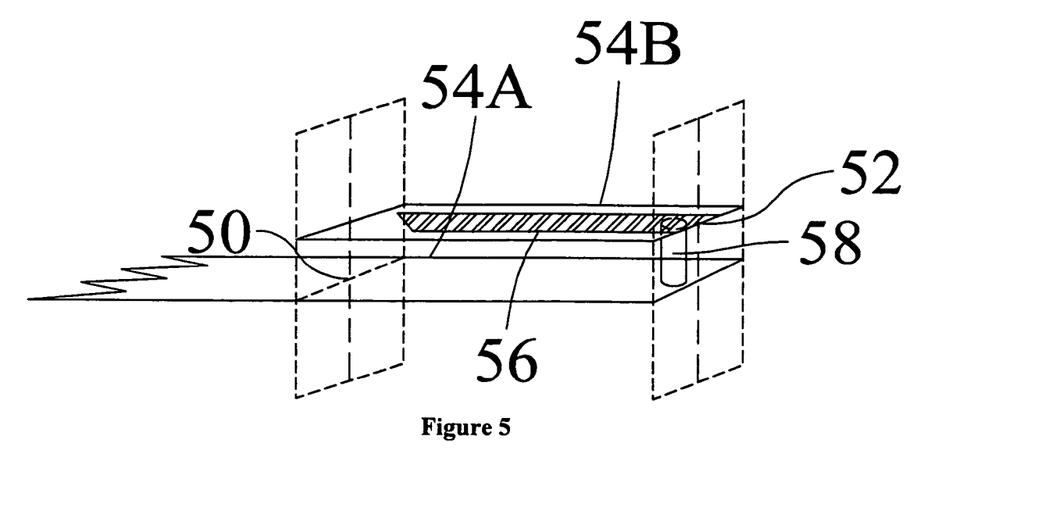
FIG. 5 illustrates a transition for a first embodiment of the present invention.

FIG. 5 shows a mechanical drawing of a first embodiment of a transition for a substrate according to the present invention. The transition provides electrical connection to one terminal of a packaged FET where the transition has an input 50, and an output 52, and where the output of the transition is located at the same plane as the input of the FET. The transition comprises a pair of broadside coupled lines 54A, 54B arranged in a multilayer substrate, so that the top section of the pair of broadside coupled lines 54B is on the top surface of the top layer of the multilayer substrate, and so that the lower section of the pair of broadside coupled lines 54A is on the surface of a lower layer in the multilayer substrate. The input of the transition 50 is located at one end of the lower section of the pair of broadside coupled lines 54A, and the output of the transition 52 is located at the opposite end of the top section of the pair of broadside coupled lines 54B. The top section of the pair of broadside coupled lines 54B has a width which is greater than or equal to the width of the lead of the FET 56, and has a length which is greater than or equal to the length of the lead of the FET 56. The FET lead 56 is soldered directly to the top section of the pair of broadside coupled lines 54B so that the input of the FET is located near the output of the transition 52 as described above. The lower section of the pair of broadside coupled lines 54A is arranged so that it lies in register with the top section of the pair of broadside coupled lines 54B, and is connected either directly to a matching circuit of the FET, located at the transition input 50, or to a remotely located matching circuit of the FET via a microstrip transmission line of a given characteristic impedance. An electrically conducting via hole 58 is located at the end of the top section of the pair of broadside coupled lines 54B nearest the transition output 52, and this via hole 58 runs through the substrate and connects to the same end of the bottom section of the pair of broadside coupled lines 54A. The electrical length from the input of the transition 50 to the output of the transition 52 is equal to one half of the wavelength of the centre frequency of a given operating band of the FET.

Table 3 gives the physical dimensions of the transition of FIG. 5 where the transition is fabricated in a multilayer LTCC substrate, where the transition is to be used for electrical connection to the gate or to the drain of the FET of FIG. 1 and where the frequency of operation of the FET is in the range 23 GHz to 25 GHz.

TABLE 3

Physical properties of LTCC transition suitable for RF connection to FET of FIG. 1, for operation in the frequency range 23 GHz to 25 GHz.

| | |
|---|---|
| Height of substrate | 0.32 mm |
| Length of coupled line pair | 2.22 mm |
| Width of coupled line pair | 0.6 mm |
| Vertical spacing between lines | 0.08 mm |
| Height of bottom section above ground plane | 0.24 mm |

Figure 6:
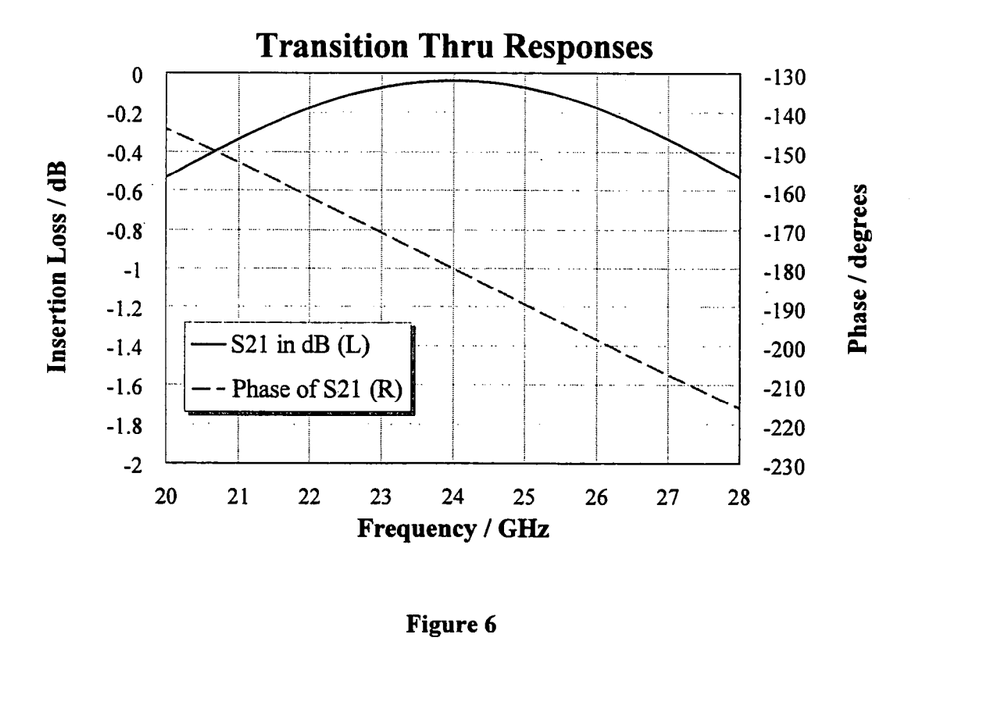
FIG. 6 shows the responses of a transition described by table 3.

FIG. 6 shows the thru responses resulting from an electromagnetic simulation of the transition of FIG. 5 with the mechanical dimensions given in table 3. It can be seen that the insertion loss is less than 0.1 dB in the frequency range of operation and that the phase delay between the input and output lies in the range from 170° to 190°—a phase delay of 180° from input to output at a given frequency is equivalent to one half of the wavelength at the same frequency.

Figure 7A:
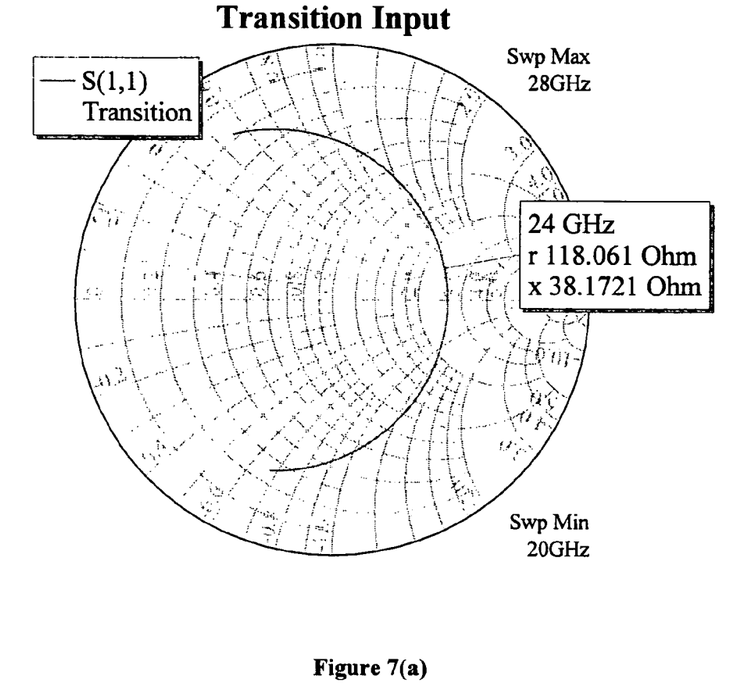
FIG. 7(a) is a Smith chart showing the impedance measured at the input 50 of the transition of FIG. 5, for the case where the impedance of FET port terminating the transition output 52 is 120+40j Ohms at 24 GHz.

FIG. 7a shows the impedance at the transition input, 50 plotted on a Smith chart for the arbitrarily selected case where the impedance of the port of the FET terminating the output of the transition 52 is 120+40j Ohms. From FIG. 7a, it can be seen that the impedance measured at the transition input 50 at 24 GHz is indeed equal to the FET input impedance, ie 120+40j Ohms.

Figure 7B:
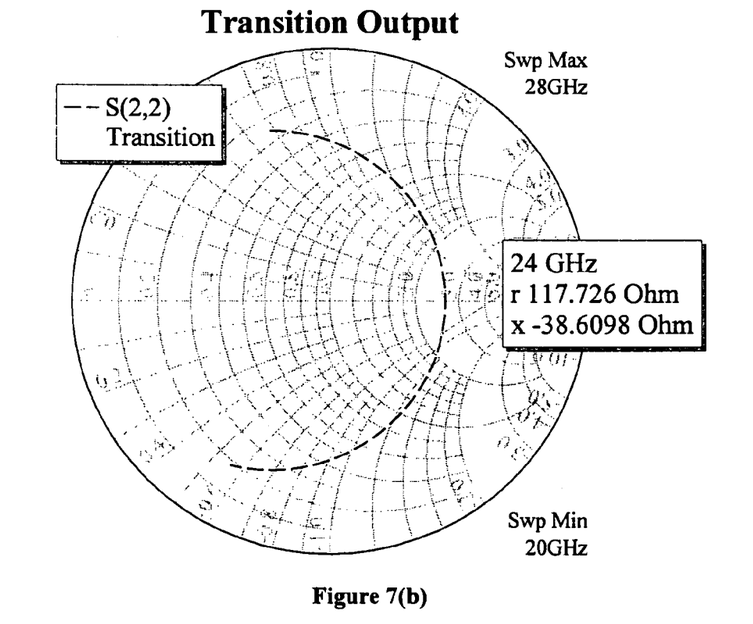
FIG. 7(b) is a Smith chart showing the impedance measured at the transition output 52 for the case where the impedance terminating the transition input 50 is 120−40j Ohms at 24 GHz.

For this case, an ideal matching circuit for the FET should have an impedance of 120−40j Ohms at 24 GHz, and this impedance should be presented at the input of the FET via the transition of FIG. 5. FIG. 7b shows a Smith chart plot of the impedance measured at the output of the transition 52, when terminated at the input by an impedance of 120−40j Ohms and it can be seen that the impedance measured at the transition output 52 is indeed 120−40j Ohms at 24 GHz.

Hence, the transition has been demonstrated to have the required electrical properties, i.e. the impedance measured at the input of the transition 50 is equal to the impedance terminating the output of the transition, and similarly the impedance measured at the output of the transition 52 is equal to the impedance terminating the input of the transition.

Figure 8:
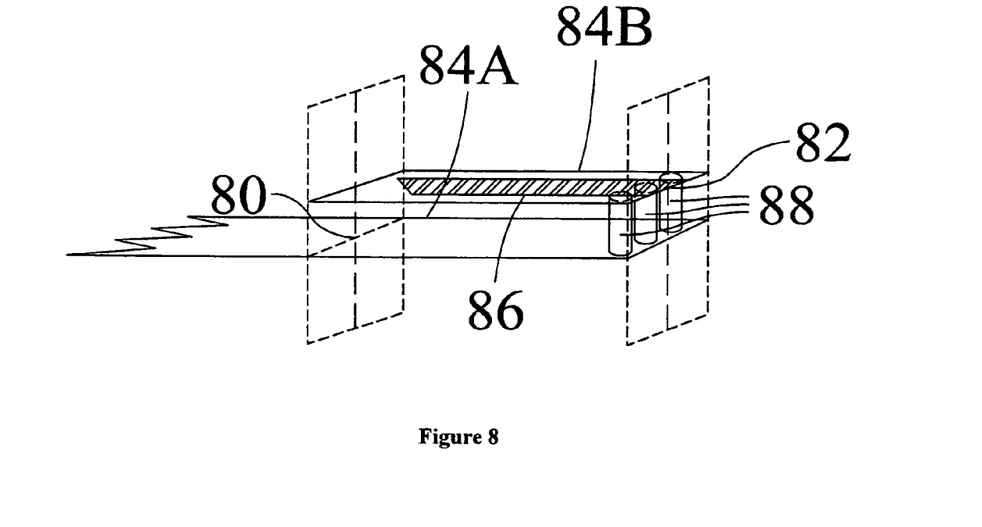
FIG. 8 illustrates a transition for a second embodiment of the present invention.

FIG. 8 shows a mechanical drawing of a second embodiment of a transition for a substrate according to the present invention. The transition depicted in FIG. 8 has all of the features as the first embodiment except that in this case, multiple vias 88 are located at the end of the pair of broadside coupled lines 84A, 84B nearest the transition output 82; the purpose of the multiple vias 88 being electrical connection from the lower section 84A to the top section 84B of the pair of broadside coupled lines.

The use of multiple via holes as described by this embodiment reduces the unwanted parasitic inductance and resistance of the single via hole described in the first embodiment.

Figure 9:
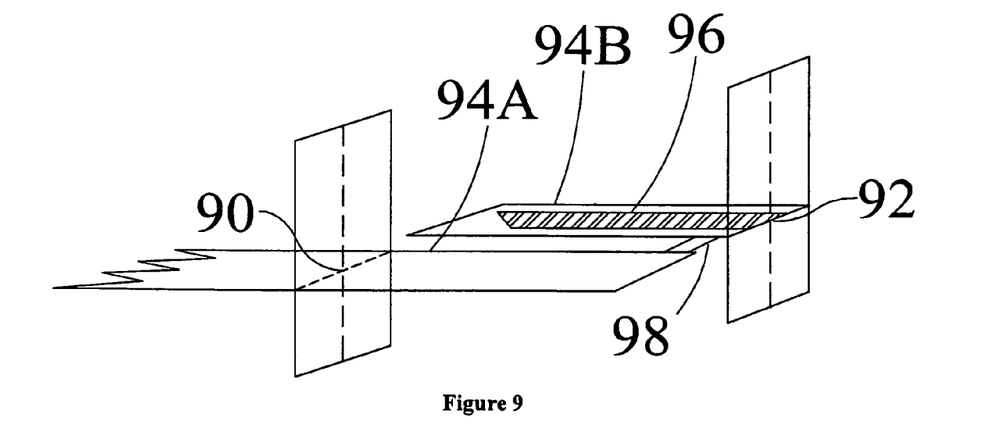
FIG. 9 illustrates a transition for a third embodiment of the present invention.

FIG. 9 shows a mechanical drawing of a third embodiment of a transition for a substrate according to the present invention. As before, the transition provides electrical connection to one terminal of a packaged FET 96 where the transition has an input 90 and an output 92 and where the output of the transition 92 is located at the same plane as the input of the FET. The transition comprises a pair of edge coupled lines comprising an input section 94A and an output section 94B arranged side-by-side on the surface of a substrate. The input of the transition 90 is located at one end of the input section 94A of the pair of edge coupled lines, and the output of the transition 92 is located at the other end of the output section 94B of the pair of edge coupled lines. The output section 94B of the pair of edge coupled lines has a width which is greater than or equal to the width of the lead of the FET 96, and has a length which is greater than or equal to the length of the lead of the FET. The FET lead 96 is soldered directly to the output section 94B of the pair of edge coupled lines so that the input of the FET is located near the output of the transition 92 as described above. The input of the transition 90 is connected to a matching circuit of the FET, either directly or via a microstrip transmission line of a given characteristic impedance. An electrically conducting bridge 98 connects together the two ends of the coupled lines 94A, 94B nearest the transition output 92.

Figure 10A:
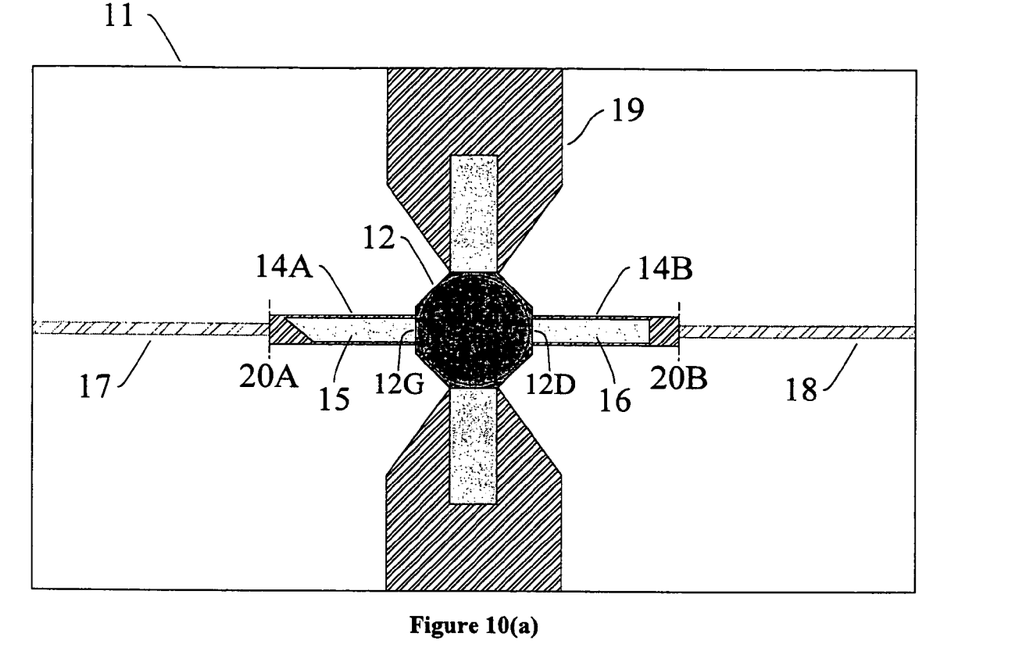
FIG. 10(a) is a top view of a PCB for mounting the FET of FIG. 1 using a pair of the transitions of FIG. 5.

FIG. 10(a) shows a top view of a substrate 11, for example a PCB or LTCC substrate suitable for mounting a FET 12 using a pair of transitions 14A, 14B. The substrate comprises a FET 12 mounted near the centre of the substrate 11. The FET comprises leads 15 and 16 connected respectively to the gate 12G and the drain 12D of the FET. Electrical connections to the gate 12G and drain 12D of the FET are made via the leads 15, 16 and the transitions 14A, 14B which are connected to embedded microstrip transmission lines of specified characteristic impedances 17, 18 at the points 20A and 20B. Since the electrical length of the transition 14 is equal to one half of the wavelength of the centre frequency of the operating band of the FET, the impedance of the device measured at the input of transition 14A at the point 20A will be identical to the impedance of the FET at the gate 12G. Similarly, the since the electrical length of the transition 14B is equal to one half of the wavelength of the centre frequency of the operating band of the device, the impedance of the FET measured at the input of transition 14B at the point 20B will be identical to the impedance of the FET at the drain 12D. Moreover since transitions 14A and 14B are connected in series with the FET 12, the combined increase in the electrical length arising from transitions 14A and 14B, will be one full wavelength at the centre frequency of the operating band of the FET, so that the through parameters measured between the points 20A and 20B of the substrate 11 will be identical to the through parameters measured between the gate 12G and the drain 12D of the FET 12.

Consequently, all of the electrical characteristics at the points 20A and 20B of the substrate 11 of the present invention will be identical to the electrical characteristics at the gate 12G and at the drain 12D of the FET. In this way, it is apparent that employing a pair of transitions 14A and 14B negates the effects of the leads 15, 16 from the electrical characteristics of the FET.

Figure 10B:
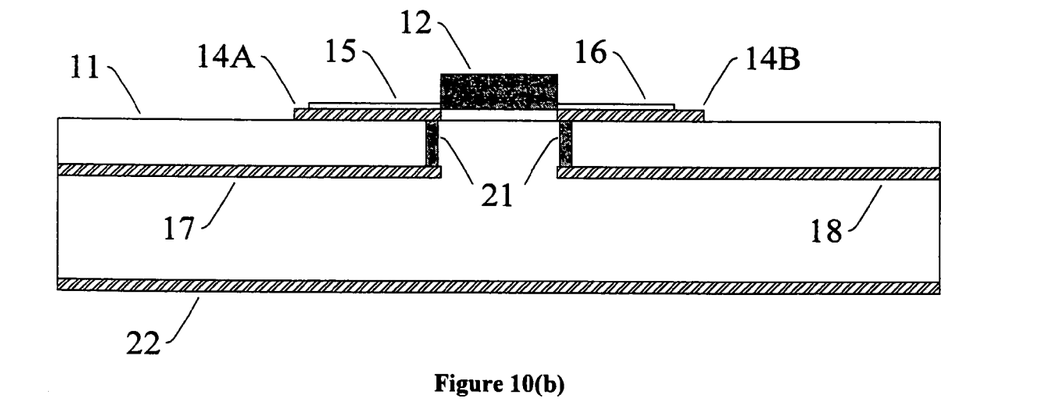
FIG. 10(b) is a side view of the PCB of FIG. 10(a).

FIG. 10(b) shows a side view of the PCB or substrate of FIG. 10(a), showing, in addition to FIG. 10(a), a ground plane 22, and vias 21 which form part of the transitions 14A and 14B.

The invention claimed is:

1. A substrate for mounting a device including at least one transition for providing an RF connection to a lead of the device, said lead extending from a device input to an otherwise free end, the transition comprising two spaced apart electrically coupled members, the first member occupying at least the same area on a top surface of the substrate as the device lead to which it is to connect, and the second member lying in register with the first member,
wherein the transition comprises an output which is located at the end of the first member which is in register with the device input and an input which is located at the opposite end of the second member and wherein the electrical characteristics of the transition are such that for a given operating band of the device, the electrical length from the input of the transition to the output of the transition is equal to half of the wavelength of the centre frequency of the operating band of the device.

2. A substrate as claimed in claim 1 further comprising a matching circuit located at the input side of the second member, the impedance presented at the output of the transition being substantially identical to that of the matching circuit in the operating frequency range of the device.

3. A substrate as claimed in claim 1 wherein the second member of the transition is embedded in the substrate and an electrical connection is made by at least one via extending between the first and second member.

4. A substrate as claimed in claim 1 wherein the second member of the transition is formed on the surface of the substrate and wherein an electrical connection is made by a bridge between the first and second member.

5. A substrate as claimed in claim 3 wherein the electrical connection is located close to the output side of the transition.

6. A substrate as claimed in claim 1 wherein at least one of the members of the transition is a microstrip line.

7. A substrate as claimed in claim 1 wherein the substrate is one of a ceramic substrate and a printed circuit board.

8. A substrate as claimed in claim 3 wherein the electrical characteristics of the transition are determined by: the depth of the substrate, the depth the second member is embedded in the substrate; the width of the second member; the length of the first and second members; the spacing between the first and second members; and by the dielectric constant of the substrate material.

9. A substrate as claimed in claim 4 wherein the electrical characteristics of the transition are determined by: the depth of the substrate; the width of the second member; the length of the first and second members; the spacing between the first and second members; and by the dielectric constant of the substrate material.

10. A substrate as claimed in claim 4 wherein the electrical connection is located close to the output side of the transition.

* * * * *